United States Patent
Yu et al.

(10) Patent No.: US 12,389,627 B2
(45) Date of Patent: Aug. 12, 2025

(54) SILICON GERMANIUM FINS AND INTEGRATION METHODS

(71) Applicant: GlobalFoundries U.S. Inc., Malta, NY (US)

(72) Inventors: Hong Yu, Clifton Park, NY (US); Haiting Wang, Clifton Park, NY (US); Zhenyu Hu, Clifton Park, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 537 days.

(21) Appl. No.: 17/644,563

(22) Filed: Dec. 16, 2021

(65) Prior Publication Data

US 2023/0197849 A1   Jun. 22, 2023

(51) Int. Cl.
   *H10D 30/62* (2025.01)
   *H10D 30/01* (2025.01)
   *H10D 62/832* (2025.01)

(52) U.S. Cl.
   CPC ........... *H10D 30/62* (2025.01); *H10D 30/024* (2025.01); *H10D 62/832* (2025.01)

(58) Field of Classification Search
   CPC .............. H01L 29/785; H01L 29/161; H01L 29/66795; H01L 29/1054; H01L 29/7851
   See application file for complete search history.

(56) References Cited

U.S. PATENT DOCUMENTS

| | | | |
|---|---|---|---|
| 7,993,999 B2 * | 8/2011 | Basker ................. | H10D 86/011 438/151 |
| 8,703,565 B2 | 4/2014 | Chang et al. | |
| 10,340,195 B2 | 7/2019 | Loubet et al. | |
| 10,833,003 B1 * | 11/2020 | Chou ................. | H10D 30/0243 |
| 11,139,432 B1 * | 10/2021 | Liu ........................ | H10D 84/038 |
| 2014/0353760 A1 * | 12/2014 | Loubet .............. | H10D 84/0193 257/369 |
| 2016/0141368 A1 * | 5/2016 | Cheng .................. | H10D 86/011 438/479 |
| 2016/0204131 A1 * | 7/2016 | Cheng .................. | H10D 30/798 438/154 |
| 2017/0084733 A1 | 3/2017 | Loubet et al. | |
| 2018/0145073 A1 * | 5/2018 | Bentley .............. | H10D 84/0158 |
| 2019/0157427 A1 * | 5/2019 | Li ......................... | H10D 84/016 |
| 2019/0393104 A1 * | 12/2019 | Ando .................. | H10D 84/038 |
| 2020/0111714 A1 * | 4/2020 | Lee ...................... | H10D 30/751 |
| 2020/0135467 A1 * | 4/2020 | Ma ....................... | H10D 84/017 |
| 2020/0144131 A1 * | 5/2020 | Miller ................ | H10D 84/0184 |

* cited by examiner

*Primary Examiner* — Fernando L Toledo
*Assistant Examiner* — Marshall Mu-Nuo Hatfield
(74) *Attorney, Agent, or Firm* — Francois Pagette

(57) ABSTRACT

A structure is provided, the structure comprising a substrate and a first silicon germanium fin over the substrate. A first silicon germanium layer may be arranged in the substrate, whereby the first silicon germanium layer may be coupled to the first silicon germanium fin. A second silicon germanium layer may be arranged in the substrate, whereby the second silicon germanium layer may be coupled to the first silicon germanium fin.

14 Claims, 6 Drawing Sheets

SILICON GERMANIUM FINS AND INTEGRATION METHODS

FIELD OF THE INVENTION

The disclosed embodiments relate generally to semiconductor device structures, and more particularly, to silicon germanium fins.

BACKGROUND

Transistors are fundamental device elements of modern digital processors and memory devices and have found applications in high-power electronics. One type of transistor that has emerged within the metal oxide semiconductor field effect transistors (MOSFETs) family of transistors is a fin field effect transistor (finFET). In a finFET, a conventional planar semiconducting channel is replaced by a semiconducting fin that extends outward from the substrate surface. In such a device, the gate, which controls current flow in the fin wraps around three sides of the fin to influence current flow from three surfaces instead of one. The improved control achieved with a finFET design results in faster switching performance and reduced current leakage than is possible with a planar transistor.

Silicon germanium is a commonly known semiconductor material. The electron mobility and hole mobility of silicon germanium are greater than that of silicon. It may be desirable to have finFET transistors fabricated from silicon germanium. However, the fabrication process of finFET transistors using silicon germanium is challenging as downstream processes, for example, the formation of isolation structures, may damage the silicon germanium fins. Thereby, there is a need for an improved silicon germanium finFET structure and integration methods to overcome the challenges mentioned above.

SUMMARY

In an aspect of the present disclosure, a structure is provided, the structure comprising a substrate and a first silicon germanium fin over the substrate. A first silicon germanium layer may be arranged in the substrate, whereby the first silicon germanium layer may be coupled to the first silicon germanium fin. A second silicon germanium layer may be arranged in the substrate, whereby the second silicon germanium layer may be coupled to the first silicon germanium fin.

In another aspect of the present disclosure, a structure is provided, the structure comprising a substrate and a first silicon germanium fin over the substrate. The first silicon germanium fin may have a bottom surface. A first silicon germanium layer may be arranged in the substrate. The first silicon germanium layer may be coupled to the first silicon germanium fin. The bottom surface of the first silicon germanium fin may contact a portion of the first silicon germanium layer. A second silicon germanium layer may be arranged in the substrate. The second silicon germanium layer may be coupled to the first silicon germanium fin. The bottom surface of the first silicon germanium fin may contact a portion of the second silicon germanium layer. The second silicon germanium layer may be spaced from the first silicon germanium layer.

In yet another aspect of the present disclosure, a method of fabricating a structure is provided, the method comprising forming a first silicon germanium fin over a substrate. A first silicon germanium layer in the substrate may be formed, whereby the first silicon germanium layer may be coupled to the first silicon germanium fin. A second silicon germanium layer in the substrate may be formed, whereby the second silicon germanium layer may be coupled to the first silicon germanium fin.

BRIEF DESCRIPTION OF THE DRAWINGS

The disclosed embodiments will be better understood from a reading of the following detailed description, taken in conjunction with the accompanying drawings.

Figure 1:
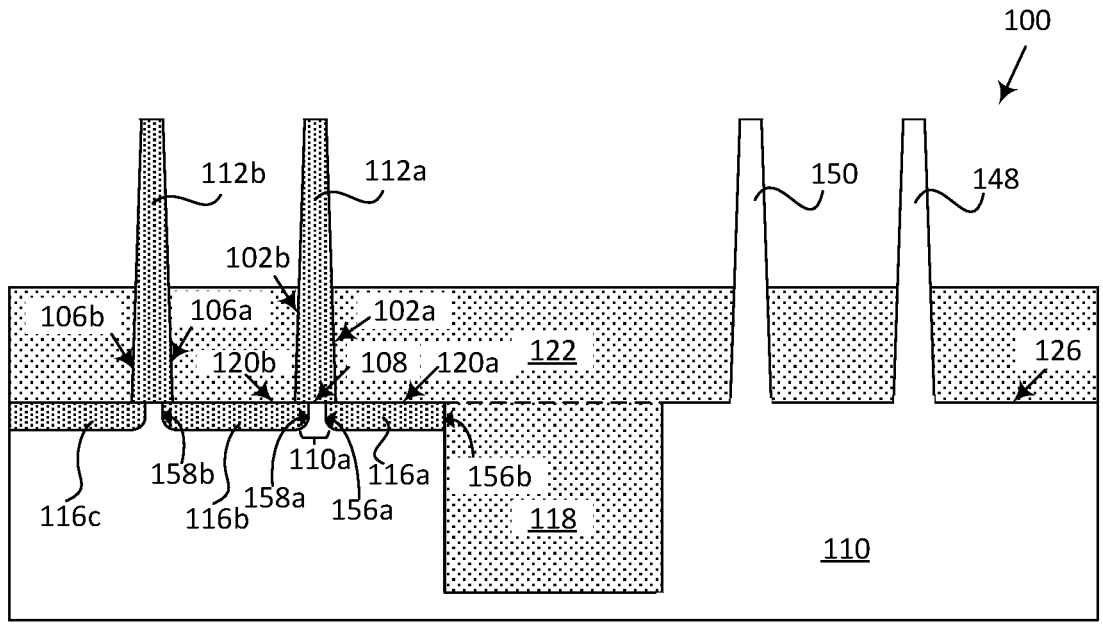
FIG. 1 shows a structure, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

FIG. 1 shows a structure 100, according to an embodiment of the disclosure. In one embodiment, the structure 100 may be for a vertical field effect transistor. In another embodiment, the structure 100 may be for a vertical nanowire. In yet another embodiment, the structure 100 may be for a fin field effect transistor. The structure 100 includes a substrate 110, a silicon germanium fin 112a, a first silicon germanium layer 116a, and a second silicon germanium layer 116b. The silicon germanium fin 112a may be arranged over the substrate 110. The silicon germanium fin 112a may have a first side surface 102a, a second side surface 102b opposite to the first side surface 102a and a bottom surface 108 between the first 102a and second 102b side surfaces. The silicon germanium fin 112a may have tapered side surfaces 102a and 102b, resulting in a top surface narrower than the bottom surface 108. In one embodiment, the silicon germanium fin 112a may have the shape of a vertical nanowire. The first silicon germanium layer 116a may be arranged in the substrate 110 and may be coupled to the silicon germanium fin 112a. The second silicon germanium layer 116b may be arranged in the substrate 110 and may be coupled to the silicon germanium fin 112a. A first side 156a of the first silicon germanium layer 116a and a first side 158a of the second silicon germanium layer 116b may underlap the bottom surface 108 of the silicon germanium fin 112a. The first side 156a may be arranged opposite to the first side 158a.

A portion of the bottom surface 108 near to the first side surface 102a of the silicon germanium fin 112a may be in direct contact with a portion of the first silicon germanium layer 116a. Another portion of the bottom surface 108 near to the second side surface 102b of the silicon germanium fin 112a and different from the earlier portion of the bottom surface 108 may be in direct contact with a portion of the second silicon germanium layer 116b. The first silicon germanium layer 116a may have a top surface 120a. The second silicon germanium layer 116b may have a top surface 120b. The top surfaces 120a and 120b may be co-planar with the bottom surface 108 of the silicon germanium fin 112a. The top surface 120a may directly contact the portion of the bottom surface 108 adjacent to the first side surface 102a of the silicon germanium fin 112a. The top surface 120b may directly contact the other portion of the bottom surface 108 adjacent to the second side surface 102b of the silicon germanium fin 112a. The substrate 110 may have a top surface 126. The top surfaces 120a and 120b may be co-planar with the top surface 126 of the substrate 110.

The silicon germanium layers 116a and 116b may be spaced apart such that a portion 110a of the substrate 110 may be arranged between the first silicon germanium layer 116a and the second silicon germanium layer 116b. In one embodiment, the portion 110a of the substrate 110 may have a flat top surface in direct contact with the bottom surface 108 of the silicon germanium fin 112a. For example, the middle portion of the bottom surface 108 may be in contact with the portion 110a of the substrate 110. The portion 110a may be a substrate pillar. In another embodiment, the portion 110a may fully separate the first silicon germanium layer 116a from the second silicon germanium layer 116b. For example, the first silicon germanium layer 116a may be spaced from the second silicon germanium layer 116b. In an alternative embodiment, the first silicon germanium layer 116a may be in direct contact with the second silicon germanium layer 116b. For example, a top corner of the first silicon germanium layer 116a may contact a top corner of the second silicon germanium layer 116b. The silicon germanium layers 116a and 116b may have a thickness range of 1 to 20 nanometers.

Another silicon germanium fin 112b may be arranged over the substrate 110, adjacent to and spaced from the silicon germanium fin 112a. The silicon germanium fin 112b may have a first side surface 106a opposite to the second side surface 102b of the silicon germanium fin 112a and a second side surface 106b opposite to the first side surface 106a. The silicon germanium fin 112b may have tapered side surfaces, resulting in a top surface narrower than a bottom surface. The bottom surface of the silicon germanium fin 112b may be arranged between the first 106a and second 106b side surfaces. The second silicon germanium layer 116b may extend to and may be coupled to the silicon germanium fin 112b. In one embodiment, a second side 158b of the second silicon germanium layer 116b may underlap the bottom surface of the silicon germanium fin 112b near to the first side surface 106a. A third silicon germanium layer 116c may be coupled to the silicon germanium fin 112b and underlap a portion of the bottom surface of the silicon germanium fin 112b adjacent to the second side surface 106b. The third silicon germanium layer 116c may be spaced from the second silicon germanium layer 116b. A portion of the substrate 110 directly below the silicon germanium fin 112b may separate the third silicon germanium layer 116c from the second silicon germanium layer 116b.

The silicon germanium fin 112a may have side portions adjacent to the first 102a and second 102b side surfaces and a middle portion between the side portions and directly contacting the side portions. The middle portion of the silicon germanium fin 112a may be directly above the portion 110a of the substrate. The side portions of the silicon germanium fin 112a may be directly above the portions of the first 116a and second 116b silicon germanium layers underlapping the silicon germanium fin 112a.

The silicon germanium fin 112b may have side portions adjacent to the first 106a and second 106b side surfaces and a middle portion between the side portions and directly contacting the side portions. The middle portion of the silicon germanium fin 112b may be directly above the portion of the substrate 110 separating the second silicon germanium layer 116b from the third silicon germanium layer 116c. The side portions of the silicon germanium fin 112b may be directly above the portions of the second 116b and third 116c silicon germanium layers underlapping the silicon germanium fin 112b.

Silicon fins 148 and 150 may be arranged over the substrate 110. The silicon fin 148 may be spaced apart and adjacent to the silicon fin 150. The silicon fins 148 and 150 may be made of the same material as the substrate 110. An isolation structure 118 may be arranged in the substrate 110 between the silicon fin 150 and the silicon germanium fin 112a. The first silicon germanium layer 116a may extend to the isolation structure 118. The second side 156b of the first silicon germanium layer 116a may directly contact and may be adjacent to the isolation structure 118. An interlayer dielectric layer 122 may be arranged over the substrate 110, the silicon germanium fins 112a and 112b, the silicon fins 148 and 150, the first 116a, second 116b and third 116c silicon germanium layers and the isolation structure 118. In one embodiment, upper portions of the silicon germanium fins 112a and 112b, and upper portions of the silicon fins 148 and 150 may protrude out of a top surface of the interlayer dielectric layer 122. Lower portions of the silicon germanium fins 112a and 112b may be arranged below the top surface of the interlayer dielectric layer 122. Similarly, lower portions of the silicon fins 148 and 150 may also be arranged below the top surface of the interlayer dielectric layer 122. Although not shown, a dielectric liner may be arranged on the side surfaces of the lower portions of the silicon germanium fins 112a and 112b and the silicon fins 148 and 150. In one example, the dielectric liner may be arranged between the interlayer dielectric layer 122 and the lower portions of the silicon germanium fins 112a and 112b. In another example, the dielectric liner may be arranged between the interlayer dielectric layer 122 and the lower portions of the silicon fins 148 and 150. In one embodiment, the silicon germanium fins 112a and 112b may be doped n-type to be p-channel field effect transistors (pFETs) and the silicon fins 148 and 150 may be doped p-type to be an n-channel field effect transistor (nFET).

The silicon germanium fins 112a and 112b may have a germanium concentration with a range from five percent to fifty percent. The germanium concentration of the silicon germanium fins 112a and 112b may not be uniformly distributed throughout the thicknesses of the fins 112a and 112b. For example, the germanium concentration of the side portions of the silicon germanium fins 112a and 112b may be higher than the germanium concentration of the middle portions of the silicon germanium fins 112a and 112b.

The substrate 110 may be made of a suitable semiconductor material, for example, silicon, silicon carbide or silicon germanium. The isolation structure 118 may be made of a suitable dielectric material, for example, silicon dioxide or silicon nitride. The interlayer dielectric layer 122 may be made of a suitable dielectric material, for example, silicon dioxide, silicon nitride or a low dielectric constant material.

The term "low dielectric constant material" may refer to a dielectric material having a dielectric constant lower than 3.9.

Figure 2:
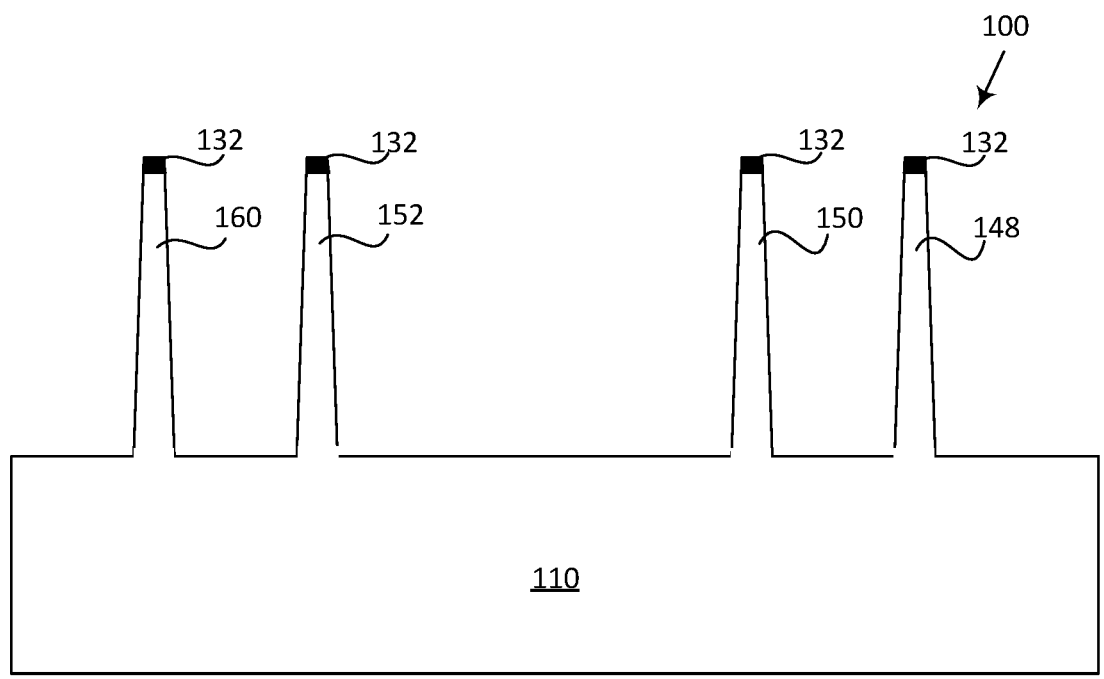
FIGS. 2 to 11 show a fabrication process flow for the structure shown in FIG. 1, according to some embodiments of the disclosure.

FIGS. 2 to 11 show a fabrication process flow for the structure 100 shown in FIG. 1, according to some embodiments of the disclosure. FIG. 2 shows a partially completed structure 100 after formation of dielectric caps 132 and a plurality of silicon fins 148, 150, 152 and 160, according to an embodiment of the disclosure. Referring to FIG. 2, a layer of a suitable dielectric material, for example, silicon nitride, silicon dioxide or silicon oxynitride may be deposited over a substrate 110 and patterned by a suitable photolithography process and a wet etch or dry etch process to form dielectric caps 132. The photolithography process may include depositing a layer of photoresist over the dielectric layer followed by exposure and developing to form suitable photoresist patterns. A wet etch or dry etch process may be used to remove portions of the dielectric layer not covered by the photoresist patterns thereby leaving behind the other portions of the dielectric layer covered by the photoresist patterns to form the dielectric caps 132. The photoresist patterns may subsequently be removed. The dielectric caps 132 may be used as a hard mask for patterning the substrate 110 to form the silicon fins 148, 150, 152 and 160. A reactive ion etching (RIE) process may be used to remove portions of the substrate 110 not covered by the dielectric caps 132, leaving behind the other portions of the substrate 110 under the dielectric caps 132 to form the silicon fins 148, 150, 152 and 160. The dielectric caps 132 on top of the silicon fins 148, 150, 152 and 160 protect the top surfaces of the silicon fins 148, 150, 152 and 160 from subsequent processing.

Figure 3:
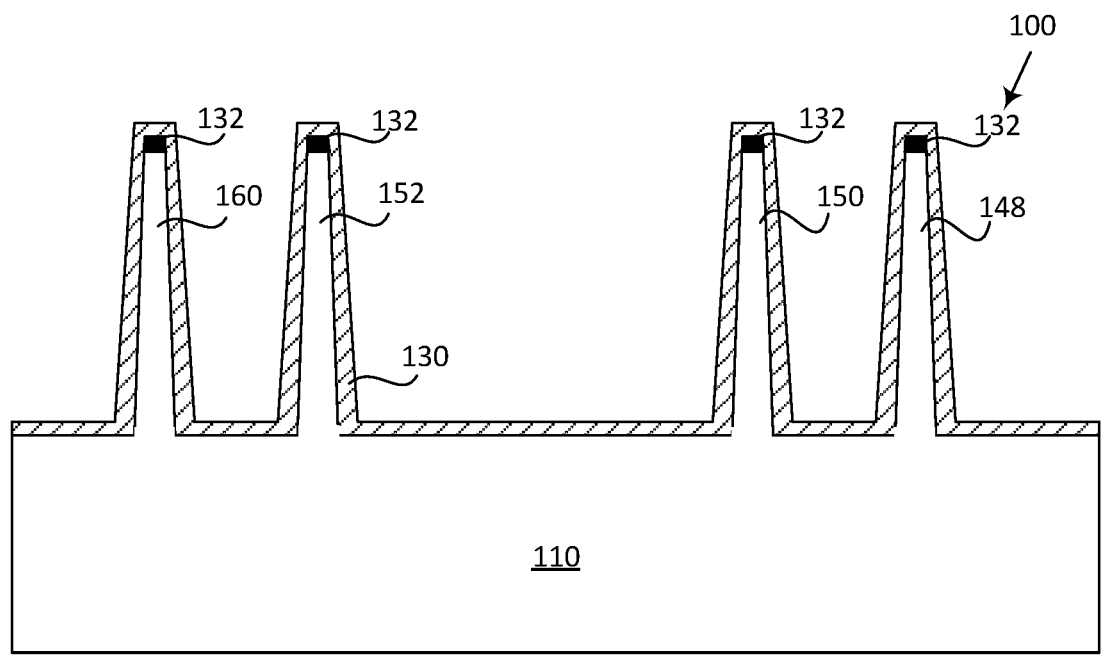

FIG. 3 shows a partially completed structure 100 after formation of a protective liner 130, according to an embodiment of the disclosure. Referring to FIG. 3, a layer of a suitable dielectric material, for example, silicon carbide, silicon carbon nitride, silicon oxycarbonitride, silicoboron carbonitride may be deposited over the silicon fins 148, 150, 152 and 160, the dielectric caps 132 and the substrate 110 to form the protective liner 130. The protective liner 130 may be deposited by a suitable deposition process, for example, chemical vapor deposition, atomic layer deposition, physical vapor deposition, or any other suitable deposition processes.

Figure 4:
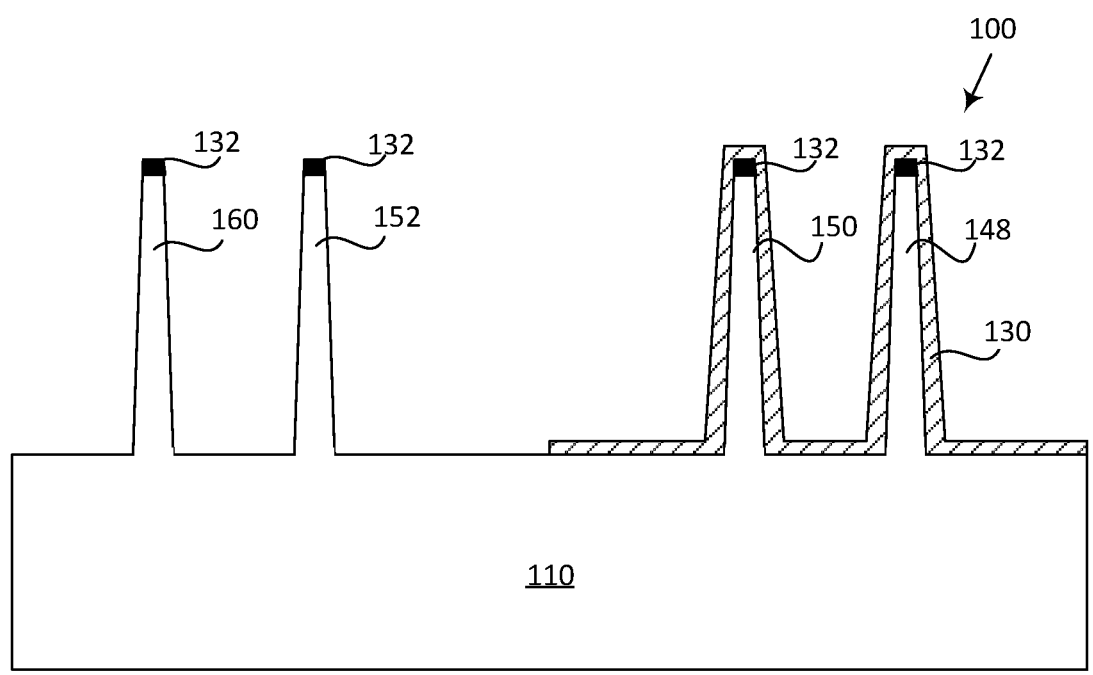

FIG. 4 shows a partially completed structure 100 after patterning the protective liner 130, according to an embodiment of the disclosure. Referring to FIG. 4, the protective liner 130 may be patterned by a suitable photolithography process followed by a wet etch or dry etch process. The patterning process may remove a portion of the protective liner 130 from the silicon fins 152 and 160, the dielectric caps 132 on top of the silicon fins 152 and 160 and top surfaces of the substrate 110 adjacent to the silicon fins 152 and 160. The patterning process may leave behind another portion of the protective liner 130 over the silicon fins 148 and 150, the dielectric caps on top of the silicon fins 148 and 150 and top surfaces of the substrate 110 adjacent to the silicon fins 148 and 150. The protective liner 130 and the dielectric caps 132 may be made of dielectric materials with different etch selectivity. The term "etch selectivity" may refer to a ratio of etching rates between different materials. For example, the protective liner 130 may be made of silicon carbide, silicon carbon nitride, silicon oxycarbonitride, silicoboron carbonitride while the dielectric caps 132 may be made of silicon nitride, silicon oxynitride or silicon dioxide. The protective liner 130 may be made of a material with a higher etching rate as compared to the dielectric caps 132.

Figure 5:
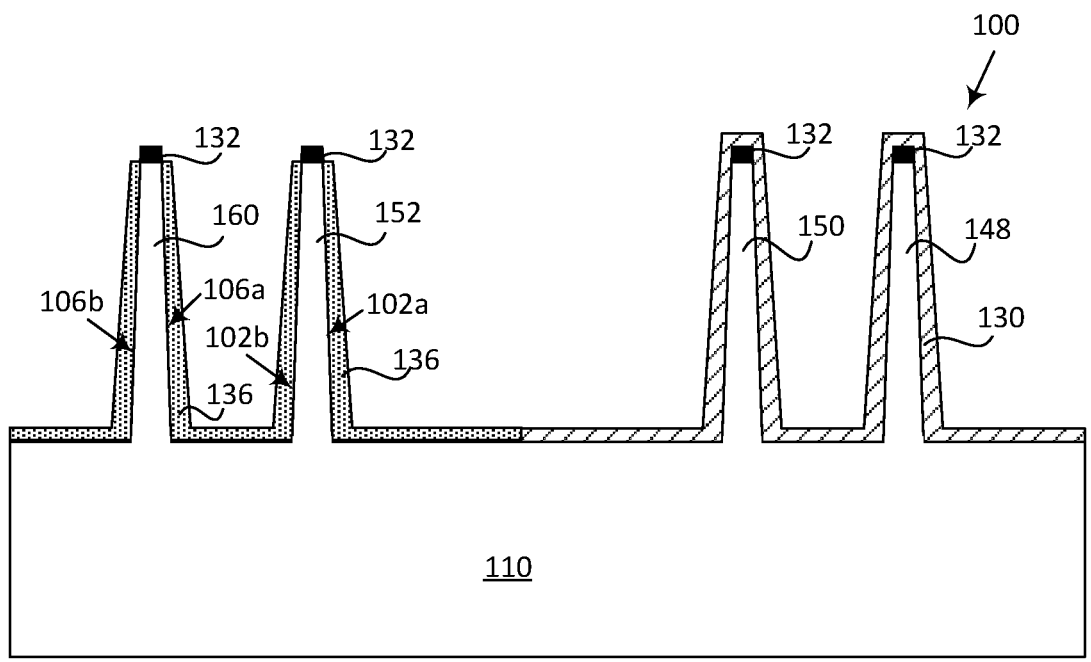

FIG. 5 shows a partially completed structure 100 after formation of a silicon germanium condensation layer 136, according to an embodiment of the disclosure. Referring to FIG. 5, the silicon germanium condensation layer 136 may be formed over the silicon fins 152 and 160. The silicon germanium condensation layer 136 may also be formed over the top surfaces of the substrate 110 adjacent to a first side surface 102a and a second side surface 102b of the silicon fin 152 and top surfaces of the substrate 110 adjacent to a first side surface 106a and a second side surface 106b of the silicon fin 160. The formation of the silicon germanium condensation layer 136 may include selective growth of a layer of silicon germanium by a suitable process, for example, epitaxial growth. The silicon germanium layer does not grow on the protective liner 130 and the dielectric caps 132.

Figure 6:
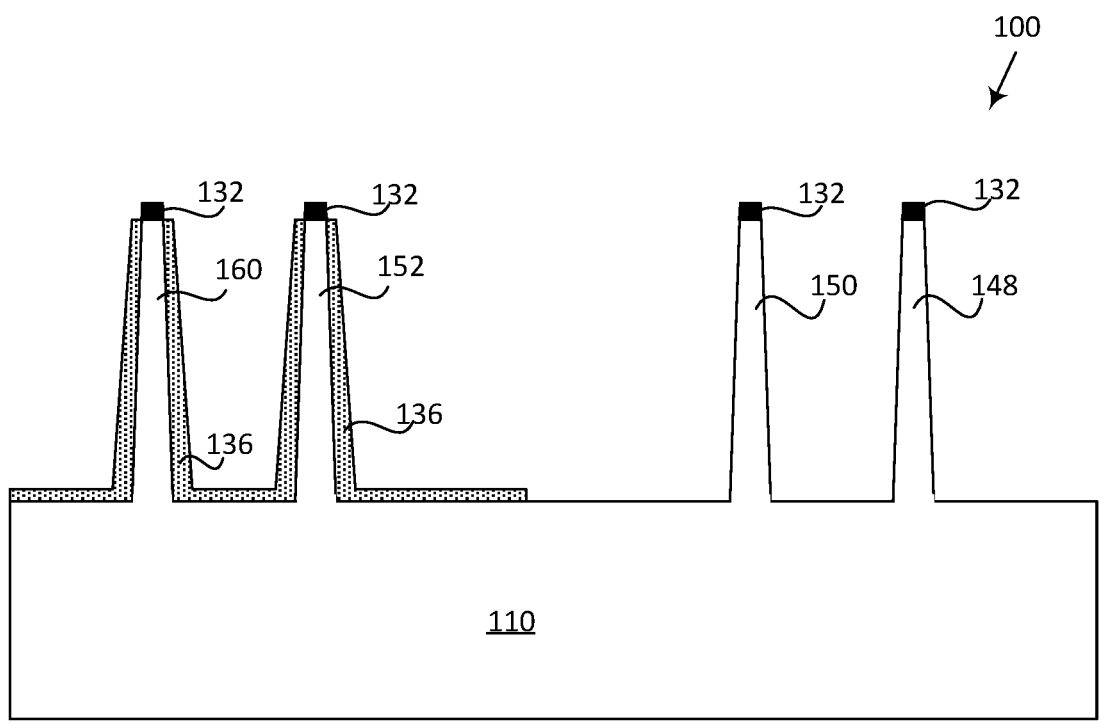

FIG. 6 shows a partially completed structure 100 after removal of the protective liner 130, according to an embodiment of the disclosure. Referring to FIG. 6, the protective liner 130 may be removed from the silicon fins 148 and 150 and top surfaces of the substrate 110 adjacent to the silicon fins 148 and 150. The removal of the protective liner 130 may be by a wet etch or dry etch process. The removal process may leave behind the silicon germanium condensation layer 136 over the silicon fins 152 and 160 and over top surfaces of the substrate 110 adjacent to the silicon fins 152 and 160. The removal process may also leave behind the dielectric caps 132 over the silicon fins 148, 150, 152 and 160.

Figure 7:
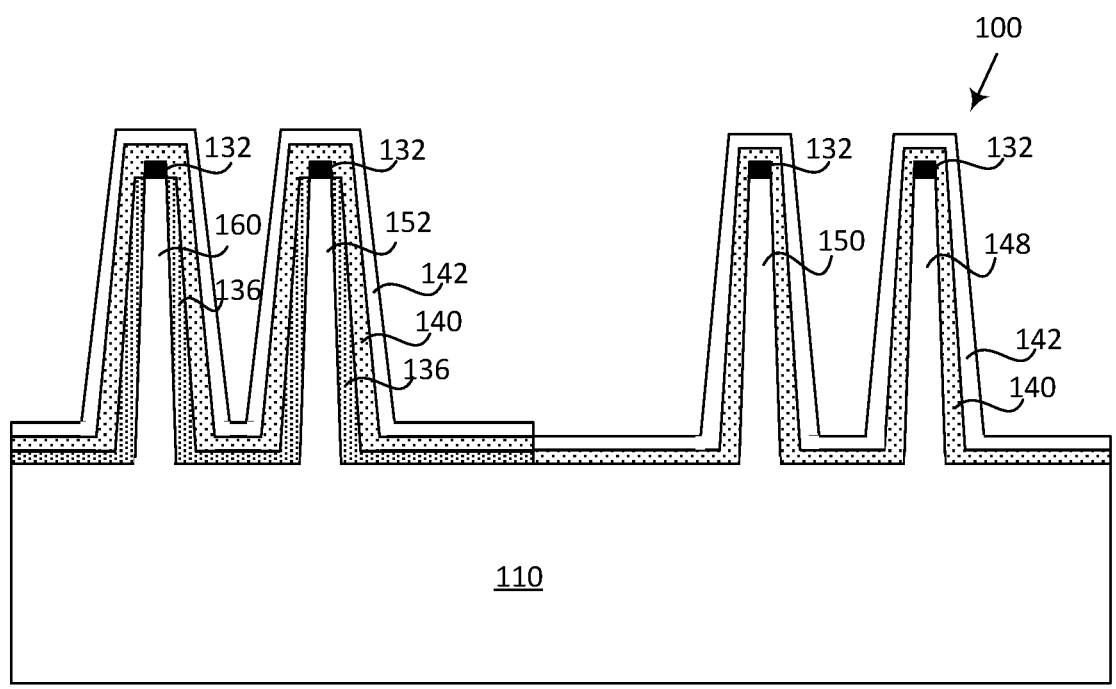

FIG. 7 shows a partially completed structure 100 after formation of a dielectric liner 140 and a polysilicon layer 142, according to an embodiment of the disclosure. Referring to FIG. 7, the dielectric liner 140 may be formed over the silicon germanium condensation layer 136 and the dielectric caps 132 above the silicon fins 152 and 160, the silicon fins 148 and 150, the dielectric caps 132 above the silicon fins 148 and 150, and top surfaces of the substrate 110 adjacent to the silicon fins 148 and 150. The formation of the dielectric liner 140 may include depositing a layer of a suitable dielectric material, for example, silicon dioxide. The polysilicon layer 142 may be formed over the dielectric liner 140 by depositing a layer of polysilicon. The dielectric liner 140 and the polysilicon layer 142 may be deposited by a suitable deposition process, for example, chemical vapor deposition, atomic layer deposition and physical vapor deposition, or any other suitable deposition processes.

Figure 8:
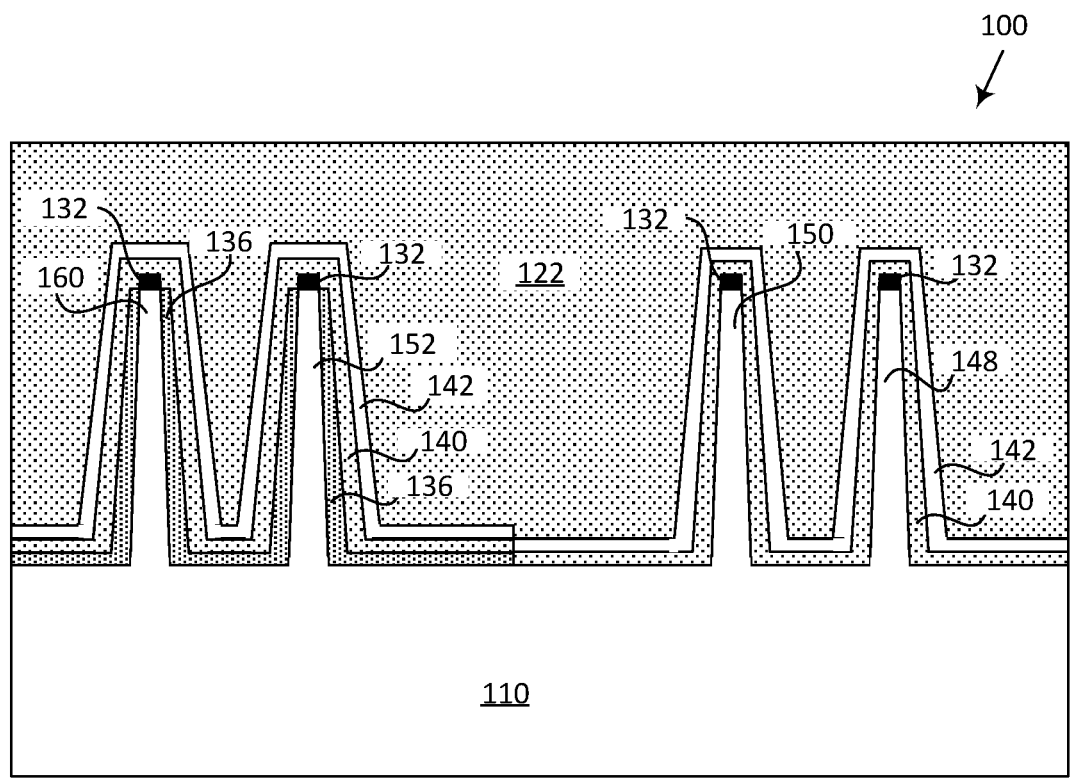

FIG. 8 shows a partially completed structure 100 after formation of an interlayer dielectric layer 122, according to an embodiment of the disclosure. Referring to FIG. 8, the interlayer dielectric layer 122 may be formed over the polysilicon layer 142. The formation of the interlayer dielectric layer 122 may include depositing a layer of a suitable dielectric material, for example, silicon dioxide, silicon nitride or a low dielectric constant material. The interlayer dielectric layer 122 may be deposited by a suitable deposition process, for example, chemical vapor deposition, physical vapor deposition, or any other suitable deposition processes.

Figure 9:
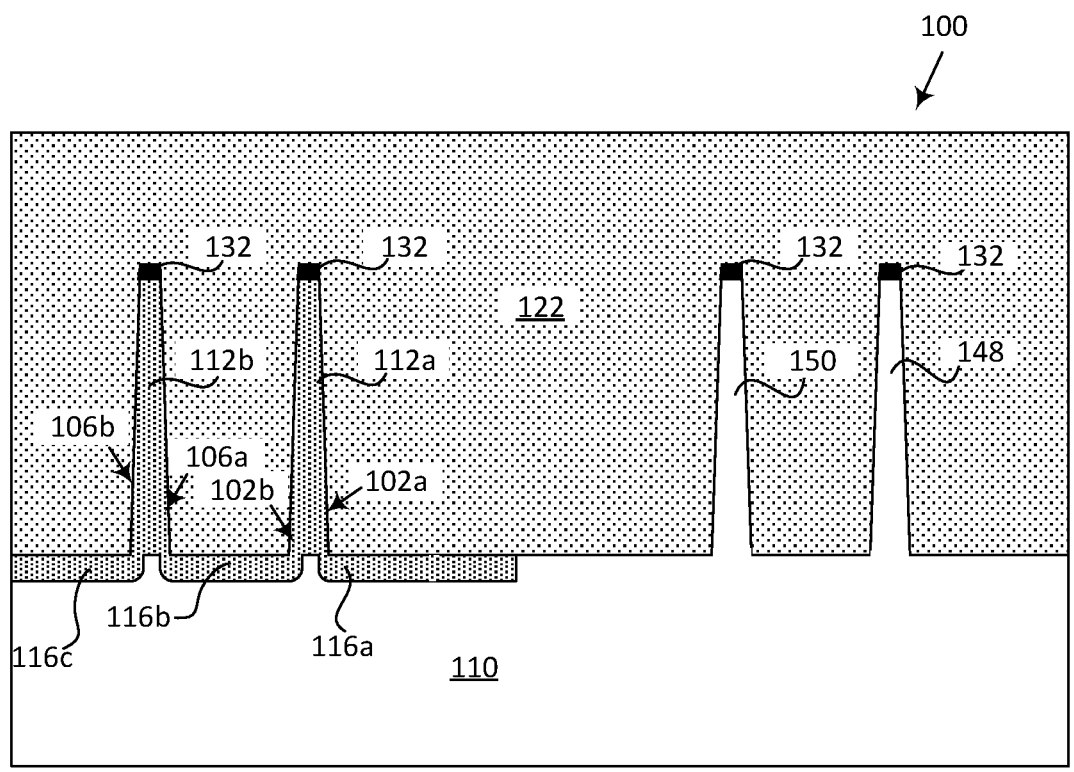

FIG. 9 shows a partially completed structure 100 after formation of silicon germanium fins 112a and 112b, and first 116a, second 116b and third 116c silicon germanium layers, according to an embodiment of the disclosure. Referring to FIG. 9, the formation of the silicon germanium fins 112a and 112b, and the first 116a, second 116b and third 116c silicon germanium layers may include a condensation step whereby the structure 100 is annealed in steam at approximately 600° C. for 60 minutes and a higher temperature anneal at approximately 1050° C. for 30 minutes. The condensation step may cause the germanium atoms in the silicon germanium condensation layer 136 to migrate to the silicon fins 152 and 160, thereby forming the silicon germanium fins 112a and 112b, respectively. The condensation step may also cause the germanium atoms in the silicon germanium condensation layer 136 to migrate to upper portions of the substrate 110 near to the first 102a and second 102b side surfaces of the silicon germanium fin 112a and near to the first 106a and second 106b side surfaces of the silicon germanium fin 112b. Although not shown for simplicity, the remaining silicon in the silicon germanium condensation layer 136 may be oxidized to form silicon dioxide, the dielectric liner 140 may remain over the silicon germanium fins 112a and 112b and the silicon fins 148 and 150, and the polysilicon layer 142 may be oxidized to form a silicon dioxide layer.

Figure 10:
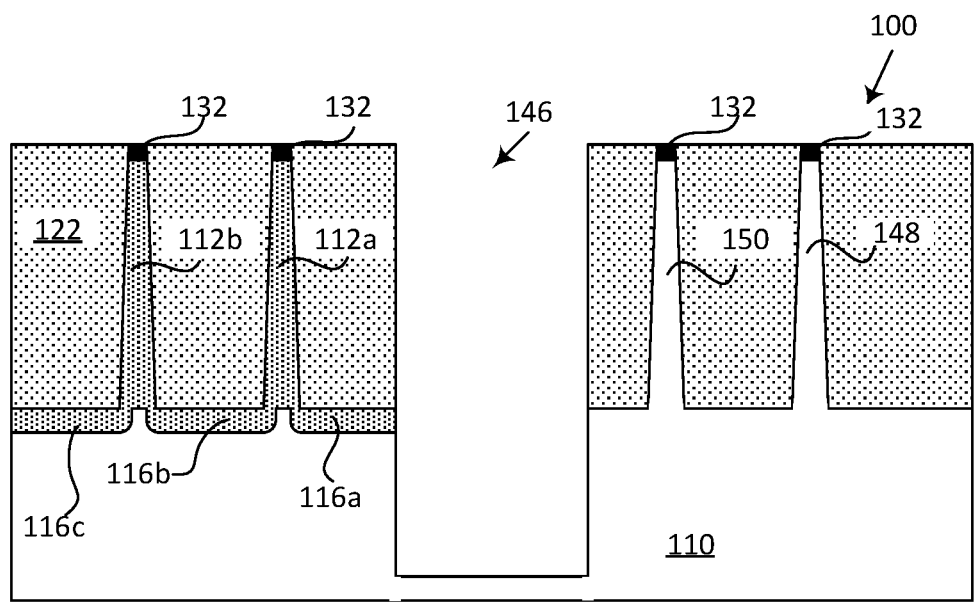

FIG. 10 shows a partially completed structure 100 after planarization of the interlayer dielectric layer 122 and formation of an opening 146 in the interlayer dielectric layer 122 and the substrate 110, according to an embodiment of the disclosure. Referring to FIG. 10, a portion of the interlayer dielectric layer 122 may be removed by chemical mechanical polishing during the planarization process. The planarization process may expose top surfaces of the dielectric caps 132. The top surfaces of the dielectric caps 132 may be co-planar with a top surface of the remaining portion of the interlayer dielectric layer 122 after the planarization process. The dielectric caps 132 protect the top surfaces of the silicon germanium fins 112a and 112b and the silicon fins 148 and 150. The opening 146 may be between the silicon germanium fin 112a and the silicon fin 150. The opening 146 may be formed by a suitable photolithography process followed by a wet or dry etch. A portion of the interlayer dielectric layer 122 and the substrate 110 between the silicon germanium fin 112a and the silicon fin 150 may be removed to form the opening 146.

Figure 11:
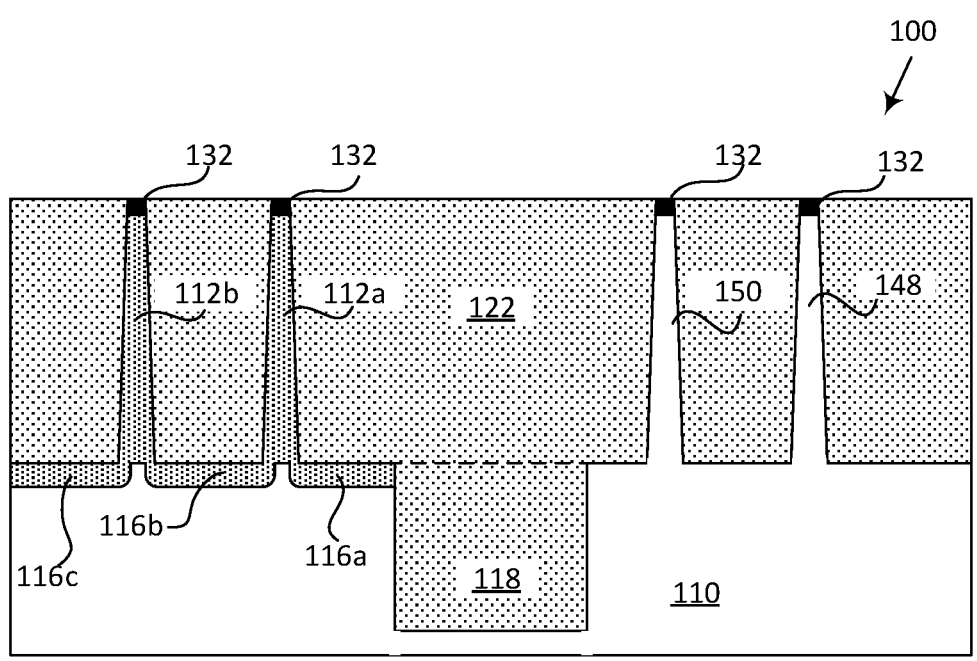

FIG. 11 shows a partially completed structure 100 after formation of an isolation structure 118 and an interlayer dielectric layer 122 between the silicon germanium fin 112a and the silicon fin 150, according to an embodiment of the disclosure. Referring to FIG. 11, the formation of the isolation structure 118 and the interlayer dielectric layer 122 between the silicon germanium fin 112a and the silicon fin 150 may include depositing a layer of a suitable dielectric material, for example, silicon dioxide or silicon nitride into the opening 146, thereby filling up the opening 146. Although not shown, the silicon dioxide layer may also be deposited above the top surface of the interlayer dielectric layer 122 and the dielectric caps 132. A suitable planarization process, for example, chemical mechanical planarization, may be used to remove a portion of the silicon dioxide layer above the interlayer dielectric layer 122 and the dielectric caps 132.

The fabrication process may continue to form the structure 100 illustrated in FIG. 1. Referring to FIG. 1, a wet etch or dry etch process may be used to remove the dielectric caps 132 from the silicon germanium fins 112a and 112b and the silicon fins 148 and 150, thereby exposing the top surfaces of the silicon germanium fins 112a and 112b and the silicon fins 148 and 150. The etching processes may also remove an upper portion of the interlayer dielectric layer 122, thereby exposing upper portions of the silicon germanium fins 112a and 112b and the silicon fins 148 and 150. The etching processes may leave behind a lower portion of the interlayer dielectric layer 122 next to lower portions of the silicon germanium fins 112a and 112b and the silicon fins 148 and 150.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:

1. A structure comprising:
   a substrate having a top surface;
   a first silicon germanium fin over the substrate and extending vertically from the top surface of the substrate, the first silicon germanium fin is of a different material from substrate material of the substrate;
   a first silicon germanium layer in the substrate and beneath the top surface of the substrate, wherein the first silicon germanium layer contacts the first silicon germanium fin; and
   a second silicon germanium layer in the substrate and beneath the top surface of the substrate, wherein the second silicon germanium layer contacts the first silicon germanium fin, wherein
   the first silicon germanium fin has a bottom surface, the first silicon germanium layer has a first side, the second silicon germanium layer has a first side, and the first side of the first silicon germanium layer and the first side of the second silicon germanium layer underlaps the bottom surface of the first silicon germanium fin, and
   a silicon fin over the substrate; and an isolation structure in the substrate between the first silicon germanium fin and the silicon fin, wherein the first silicon germanium layer has a second side which contacts the isolation structure.

2. The structure of claim 1, wherein the first silicon germanium layer has a top surface, the second silicon germanium layer has a top surface, and the bottom surface of the first silicon germanium fin is coplanar with the top surface of the first silicon germanium layer and the top surface of the second silicon germanium layer.

3. The structure of claim 1, further comprising: a portion of the substrate under the first silicon germanium fin, wherein the portion of the substrate is between the first silicon germanium layer and the second silicon germanium layer.

4. The structure of claim 3, wherein the portion of the substrate has a flat top surface contacting the bottom surface of the first silicon germanium fin.

5. The structure of claim 2, wherein the first silicon germanium layer contacts the second silicon germanium layer.

6. The structure of claim 1, further comprising:
a second silicon germanium fin over the substrate, wherein the second silicon germanium fin is spaced from the first silicon germanium fin, and the second silicon germanium layer is coupled to the second silicon germanium fin.

7. The structure of claim 6, wherein the second silicon germanium fin has a bottom surface, the second silicon germanium layer has a second side and the second side of the second silicon germanium layer underlaps the bottom surface of the second silicon germanium fin.

8. The structure of claim 1, wherein the structure is a vertical field effect transistor.

9. The structure of claim 6, wherein the first silicon germanium fin and the second silicon germanium fin have side portions and middle portions, and the side portions of the first silicon germanium fin and the second silicon germanium fin have higher germanium concentration than the middle portions of the first silicon germanium fin and the second silicon germanium fin.

10. The structure of claim 1, wherein the top surface of the substrate is horizontal, and the first silicon germanium layer and the second silicon germanium layer are beneath the horizontal top surface of the substrate, and the first silicon germanium layer has a top surface and the second silicon germanium layer has a top surface, and the top surface of the first silicon germanium layer and the top surface of the second silicon germanium layer are coplanar with the top surface of the substrate.

11. The structure of claim 1, wherein the structure is a vertical nanowire.

12. A structure comprising:
a substrate having a top surface;
a first silicon germanium fin over the substrate and extending vertically from the top surface of the substrate, the first silicon germanium fin is of a different material from substrate material of the substrate, the first silicon germanium fin having a bottom surface;
a first silicon germanium layer in the substrate and beneath the top surface of the substrate, wherein the first silicon germanium layer is coupled to the first silicon germanium fin and the bottom surface of the first silicon germanium fin contacts a portion of the first silicon germanium layer;
a second silicon germanium layer in the substrate and beneath the top surface of the substrate, wherein the second silicon germanium layer is coupled to the first silicon germanium fin and the bottom surface of the first silicon germanium fin contacts a portion of the second silicon germanium layer; and
the second silicon germanium layer is spaced from the first silicon germanium layer, wherein
the first silicon germanium layer has a first side, the second silicon germanium layer has a first side, and the first side of the first silicon germanium layer and the first side of the second silicon germanium layer underlap the bottom surface of the first silicon germanium fin, and
a silicon fin over the substrate; and
an isolation structure in the substrate between the first silicon germanium fin and the silicon fin, wherein the first silicon germanium layer has a second side which contacts the isolation structure.

13. The structure of claim 12, wherein a portion of the substrate fully separates the first silicon germanium layer from the second silicon germanium layer.

14. The structure of claim 12, wherein the first silicon germanium layer has a top surface, the second silicon germanium layer has a top surface, and the bottom surface of the first silicon germanium fin is coplanar with the top surface of the first silicon germanium layer and the top surface of the second silicon germanium layer.

* * * * *